United States Patent [19]
Asamura

[11] Patent Number: 6,074,938
[45] Date of Patent: Jun. 13, 2000

[54] METHOD OF FORMING A SEMICONDUCTOR DEVICE COMPRISING A DUMMY POLYSILICON GATE ELECTRODE SHORT-CIRCUITED TO A DUMMY ELEMENT REGION IN A SUBSTRATE

[75] Inventor: Takeshi Asamura, Chigasaki, Japan

[73] Assignee: Kabushiki Kaisha Toshiba, Kawasaki, Japan

[21] Appl. No.: 09/084,208

[22] Filed: May 26, 1998

[30] Foreign Application Priority Data

Jun. 11, 1997 [JP] Japan ................................. 9-153718

[51] Int. Cl.$^7$ ................................................ H01L 21/425
[52] U.S. Cl. .......................... 438/533; 438/592; 438/664; 438/683; 438/926
[58] Field of Search ...................... 438/238, 592, 438/597, 631, 633, 664, 683, 926, 533; 257/379, 382, 503, 499, 770

[56] References Cited

U.S. PATENT DOCUMENTS

| | | | |
|---|---|---|---|
| 4,873,204 | 10/1989 | Wong et al. | 438/649 |
| 4,980,020 | 12/1990 | Douglas | 156/643 |
| 5,173,450 | 12/1992 | Wei | 438/620 |
| 5,405,806 | 4/1995 | Pfiester et al. | 438/630 |
| 5,441,916 | 8/1995 | Motonami | 438/620 |
| 5,679,607 | 10/1997 | Liu | 438/533 |

*Primary Examiner*—Wael Fahmy
*Assistant Examiner*—Kurt Eaton
*Attorney, Agent, or Firm*—Banner & Witcoff, Ltd.

[57] ABSTRACT

The present invention relates to a semiconductor device wherein a dummy gate electrode is fixed to the same electric potential as that of a substrate, the stable operation of an LSI is maintained and the process margin is large, and also to a producing method of the semiconductor device, and the semiconductor device comprises a P-type silicon substrate, a dummy element region unnecessary for the actual LSI operation, which is formed on the P-type silicon substrate, and a dummy gate electrode unnecessary for the actual LSI operation, which is formed on at least a part of the dummy element region through a dummy oxide film, wherein by selectively forming titanium silicide on at least a part of a surface of the dummy element region and the dummy gate electrode, a $P^+$-diffusion layer and a $P^+$-dummy gate electrode of the dummy element region are short-circuited by titanium silicide.

17 Claims, 6 Drawing Sheets

METHOD OF FORMING A SEMICONDUCTOR DEVICE COMPRISING A DUMMY POLYSILICON GATE ELECTRODE SHORT-CIRCUITED TO A DUMMY ELEMENT REGION IN A SUBSTRATE

BACKGROUND OF THE INVENTION

The present invention relates to a semiconductor device comprising a dummy diffusion layer region and a dummy gate electrode which are unnecessary for actual circuit operation and a producing method of the semiconductor device.

Recently, particularly in a logic LSI (Large Scale Integrated Circuit), a part where transistors are arranged densely and a part where they are isolated from one another are present together in a LSI chip. Such a difference in density of the transistor arrangement influences the process of the size of a transistor gate electrode, for example, lithography and etching, and irregularity in the size of the gate electrodes after the process is thereby increased. In addition, a stacked interlayer insulation film is made flat by employing the technique of CMP (Chemical-Mechanical Polishing) after forming the transistors, but the thickness of the flat interlayer insulation film largely depends on the difference in density of the transistor arrangement in the substrate.

In consideration of this point, the technique of suppressing irregularity in the process by uniformly arranging dummy gate electrodes over a chip which are unnecessary for the actual LSI operation has been variously proposed.

However, a problem arises that if the dummy gate electrodes, which are unnecessary for the actual LSI operation, are kept in the floating state, they make the LSI operation unstable. In addition, another problem also arises that if the electric potential of the dummy gate electrodes is fixed to any portion in order to avoid the floating state, the wiring area is increased and the area of the chip is also increased.

BRIEF SUMMARY OF THE INVENTION

The present invention is accomplished in consideration of the above problems, and its object is to provide a semiconductor device wherein a dummy gate electrode is fixed to a predetermined electric potential by forming a dummy gate electrode in a dummy diffusion layer region (a dummy element region) and short-circuiting the dummy gate electrode and the dummy diffusion layer region in salicide process without increasing the wiring area, so that the stable operation of the LSI is maintained and the process margin is large, and also provide a producing method of the semiconductor device.

In order to achieve the above object, a first aspect of the present invention provides a semiconductor device, comprising: a semiconductor substrate; a dummy element region formed on the semiconductor substrate; and a dummy polysilicon gate electrode formed in at least a part of the dummy element region via a gate insulation film, wherein high melting point metal silicide is formed on at least a part of a surface of the dummy element region and the dummy polysilicon gate electrode, and the dummy element region and the dummy polysilicon gate electrode are short-circuited by the high melting point metal silicide.

Further, a second aspect of the present invention provides a method of producing a semiconductor device, comprising: a first step of delimiting a dummy element region on a semiconductor substrate; a second step of forming a dummy polysilicon gate electrode in at least a part of the dummy element region via a gate insulation film; a third step of forming an insulation film on side of the dummy polysilicon gate electrode; and a fourth step of selectively forming a high melting point metal silicide on the dummy polysilicon gate electrode and in the dummy element region, wherein the dummy polysilicon gate electrode is short-circuited with the dummy element region by the high melting point metal silicide.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be described below with reference to the figures.

First, a first aspect of the present invention will now be described.

Figure 2A:
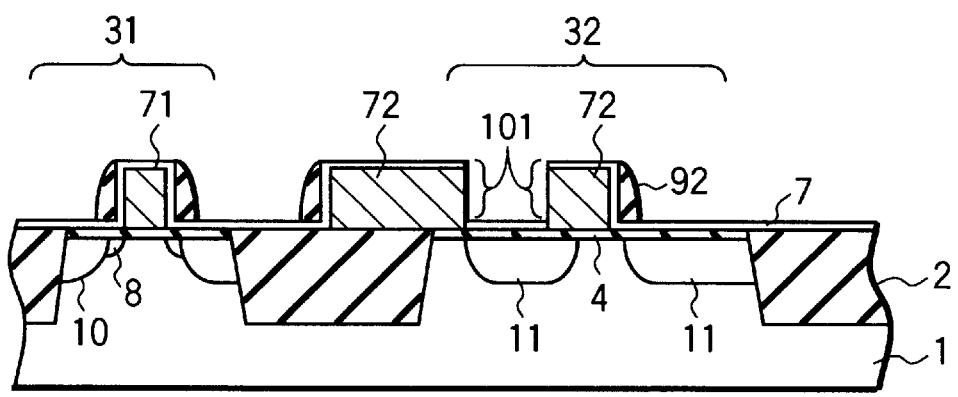
FIG. 2A is a cross-sectional view showing a structure of a semiconductor device according to a first aspect of the present invention after a fourth step of a producing method of the semiconductor device.
Figure 2B:
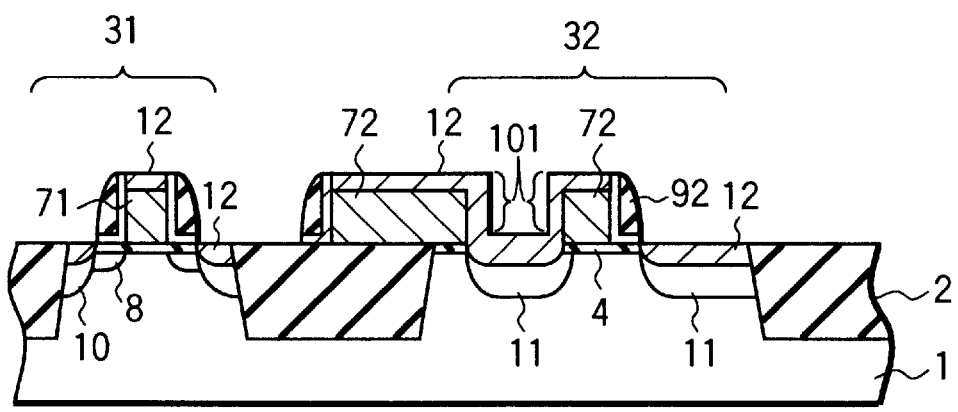
FIG. 2B is a cross-sectional view showing a structure of a semiconductor device according to a first aspect of the present invention after a fifth step of a producing method of the semiconductor device.

As shown in FIG. 2B, a semiconductor device according to the first aspect is constituted by a P-type silicon substrate 1, $P^+$-diffusion layers 11 of a dummy element region 32, which is formed on the P-type silicon substrate 1 and is unnecessary for the actual LSI operation, and a P+ dummy gate electrode 72, which is formed on at least one part of the dummy element region 32 via a gate oxide film 4 and is unnecessary for the actual LSI operation. The semiconductor device is characterized in that by selectively forming a titanium silicide 12 on at least one part of surfaces of the $P^+$-diffusion layer 11 of the dummy element region 32 and the P+ dummy gate electrode 72, the $P^+$-diffusion layer 11 of the dummy element region 32 and the P+ dummy gate electrode 72 are short-circuited by the titanium silicide 12.

The method of producing the semiconductor device according to the first aspect of the present invention will be described below with reference to FIGS. 1 and 2.

Figure 1A:
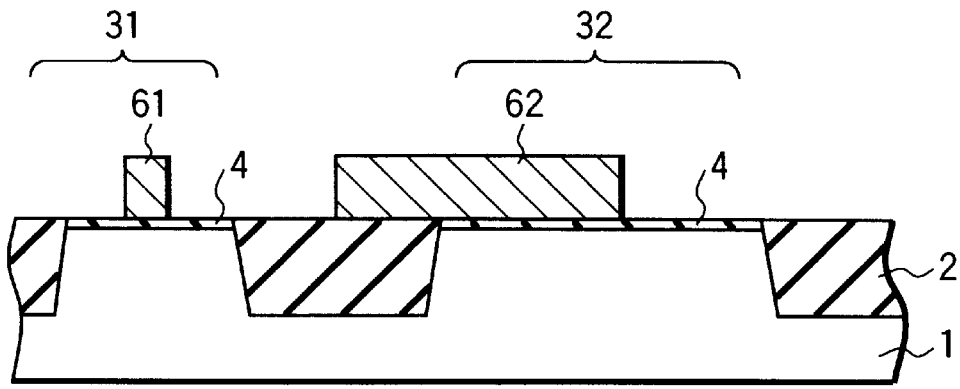
FIG. 1A is a cross-sectional view showing a structure of a semiconductor device according to a first aspect of the present invention after a first step of a producing method of the semiconductor device.
Figure 2C:
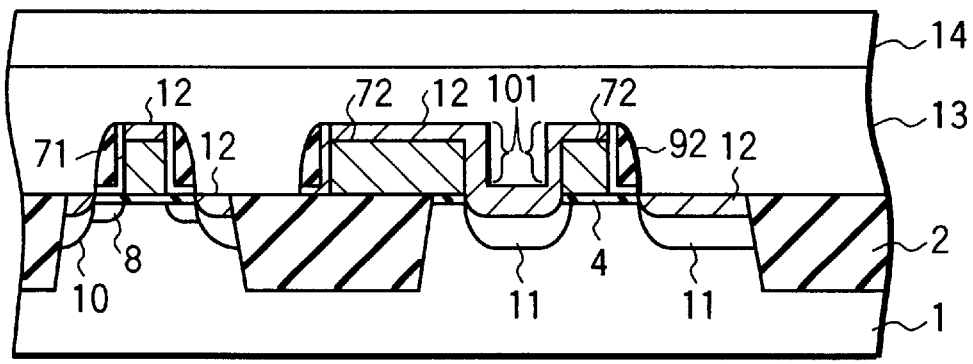
FIG. 2C is a cross-sectional view showing a structure of a semiconductor device according to a first aspect of the present invention after a sixth step of a producing method of the semiconductor device.

First, as shown in FIG. 1A, an element discrete-insulation film 2 is formed on the P-type silicon substrate 1 in the method of STI (Shallow Trench Isolation), and the element region is discretely insulated. At this time, a element region 31 required for the LSI operation is demarcated, and the dummy element region 32 unnecessary for the actual LSI operation is also demarcated.

After that, the gate oxide film 4 which is, for example, 60 Å thick is formed on the P-type silicon substrate 1, and a layer of polysilicon including no impurity (hereinafter referred to as undoped polysilicon) which is 2500 Å thick is formed.

Next, after the resist has been painted, exposed to light and patterned by a general lithography, the undoped polysilicon is selectively etched to a gate electrode 61, with the resist used as a mask, and with the gate oxide film 4 and the element discrete-insulation film 2 employed as stoppers of etching.

At this time, a dummy gate electrode 62 is also formed on the dummy element region 32. The presence of the dummy gate electrode 62 allows the gate electrode to be processed very uniformly by the lithography and the etching. The dummy gate electrode 62 may be entirely present in the dummy element region 32. Otherwise, it may be partially formed therein.

Figure 1B:
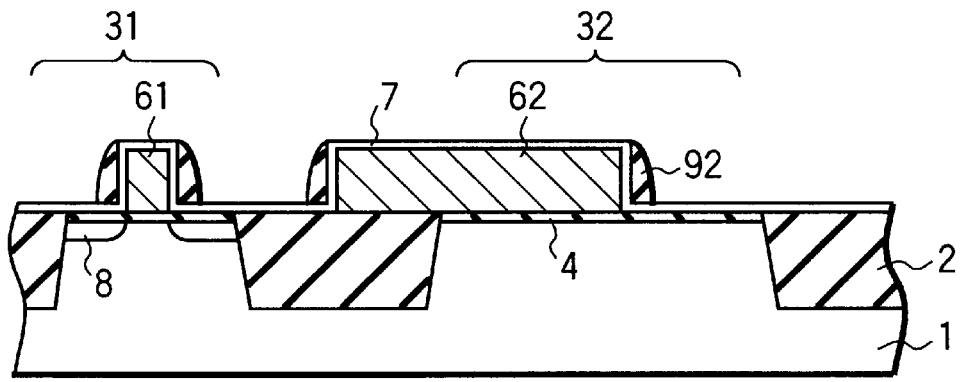
FIG. 1B is a cross-sectional view showing a structure of a semiconductor device according to a first aspect of the present invention after a second step of a producing method of the semiconductor device.

Next, as shown in FIG. 1B, after an LPCVD (Low Pressure CVD) oxide film 7 has been stacked so as to be 200 Å thick, the surface other than the element region necessary for operation of the LSI is coated with the resist, arsenic is ion-implanted at the acceleration voltage of 60 [keV] and a dose of 3e14 [1/cm$^2$], and the resist is peel off, and RTA (Rapid-Thermal-Anneal) is executed at 950° C. for thirty seconds for activation, and a thin diffusion layer 8 having an extension structure (whose depth is 800 Å) is thereby formed. At this time, the dummy gate electrode 62 and the dummy element region 32 are coated with the resist, and arsenic is not ion-implanted.

After that, the LPCVD silicon nitride film is stacked to be 1000 Å thick, and silicon nitride is entirely processed by anisotropic etching so as to be 1000 Å thick with the LPCVD oxide film 7 employed as a stopper. At this time, silicon nitride stacked on the side surfaces of the gate electrode 61 and the dummy gate electrode 62 is thick so as to be processed by the etching. The silicon nitride remains according to the thickness after the anisotropic etching and, as a result, a gate-side wall 92 is formed to be about 1000 Å thick.

Figure 1C:
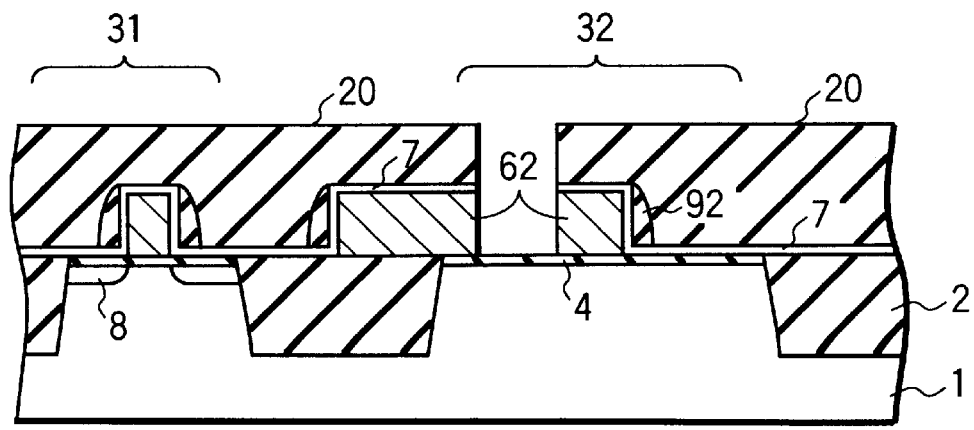
FIG. 1C is a cross-sectional view showing a structure of a semiconductor device according to a first aspect of the present invention after a third step of a producing method of the semiconductor device.

Next, as shown in FIG. 1C, the entire surface including part of the dummy gate electrode 62 in the dummy element region 32 is coated with resist 20. The LPCVD oxide film 7 at the portion of the dummy gate electrode 62 which is not coated with the resist 20 is etched by hydrofluoric acid, and the exposed silicon is removed by RIE (Reactive Ion Etching) of HBr gas with the gate oxide film 4 employed as a stopper. At this time, since a selective ratio to the gate oxide film 4 for the silicon RIE cannot be determined, recesses (not shown) may be generated on the substrate 1.

Next, as shown in FIG. 2A, the resist is peeled once, the surface other than the element region 31 necessary for the LSI operation is coated with the resist, and arsenic is ion-implanted at the acceleration voltage of 65 [keV] and the dope of 5e15 [1/cm$^2$].

At this time, the dummy gate electrode 62 and the dummy element region 32 are coated with the resist, and arsenic is not ion-implanted. After that, the resist is peeled once, and then, the element region 31 necessary for the LSI operation is coated with the resist and boron fluoride is ion-implanted to the dummy gate electrode 62 and the dummy element region 32 at the acceleration voltage of 45 [keV] and the dose of 4e15 [1/cm$^2$].

After that, for the activation the resist is peel off, and the RTA is carried out at 1050° C. for 10 seconds, a thick NMOSFET N+-diffusion layer 10 (which is 1500 Å thick) is formed together with P+-diffusion layers 11 (which is 2000 Å thick) of the dummy element region 32, and an N+ gate electrode 71 containing a impurities and P+ dummy gate electrodes 72 are formed. Thus, the P+-diffusion layers 11 of the dummy element region 32 are fixed to an electric potential of the P-type silicon substrate 1. At this stage, however, the P+ dummy gate electrodes 72 are in the floating state since the P+ dummy gate electrodes 72 are insulated from the P+-diffusion layers 11 of the dummy element region 32 via the gate oxide film 4. It is needless to say that even if a recess is formed on the P-type silicon substrate 1 in the dummy element region 32 at the stage of FIG. 1C, the relationship with the P+-diffusion layers 11 on the P-type silicon substrate 1 can be obtained, which may cause no problems.

Next, as shown in FIG. 2B, the LPCVD oxide film 7 and the gate oxide film 4 are removed by a 3% dilute hydrofluoric acid solution and, the silicon which is present on the N+ gate electrode 71, the P+ dummy gate electrodes 72, side surface portions denoted by a reference numeral 101 in FIG. 2A, the N+-diffusion layer 10 of the element region 31 and the P+-diffusion layers 11 of the dummy element region 32, is thereby exposed. At this time, if a recess is formed on the substrate at the stage of FIG. 1C, the LPCVD oxide film 7 and the gate oxide film 4 do not need to be removed at this portion since the silicon is initially exposed there. Further, even if a recess is not formed on the substrate at this portion, the gate oxide film 4 is removed by a 3% dilute hydrofluoric acid solution similarly to the other portions so that the silicon is exposed.

After that, after stacking titanium to be 300 Å thick by sputtering, relatively high resistant silicide is formed at 750° C. for thirty seconds by the RTA, as a first stage. At this time, titanium makes silicide reaction with the only exposed silicon, and remains unreacted at the other portions. After that, unreacted titanium is selectively removed by a mixture solution containing sulfuric acid and hydrogen peroxide water at a ratio of 1 to 1. Subsequently, the relatively high resistant silicide is transformed to the low resistant titanium silicide 12 by the RTA which is carried out at 850° C. for thirty seconds as a second stage. A series of processes from the titanium sputtering to the formation of the low resistant silicide are called Self-Aligned Silicide processes.

As described above, in the dummy element region 32, the P+ dummy gate electrodes 72 are insulated from the P+-diffusion layers 11 of the dummy element region 32 via the gate oxide film 4 before the silicide processes. After the silicide processes, however, the titanium silicide 12 of the side surfaces of the P+ dummy gate electrodes 72 and the titanium silicide 12 on the P+-diffusion layer 11 of the dummy element region 32 are connected and thereby become conductive. The P+ dummy gate electrodes 72 are fixed at the electric potential of the P+-diffusion layer 11 of the dummy element region 32, i.e. the electric potential of the P-type silicon substrate 1. At the same time, the titanium silicide is formed on the N+-diffusion layer 10 and the N+ gate electrodes 71 at the element region 31 contributing about LSI action. And MOSFET of silicide structure is produced.

After that, an interlayer insulation film 13 is stacked, and a semiconductor device is completed by carrying out the flattening, a general contact process (not shown), a wiring process (not shown), formation of a passivation oxide film 14, and formation of a pad (not shown). In the flattening process, the interlayer insulation film 13 is processed very uniformly because of the presence of the dummy gate electrodes (see FIG. 2C). The contact with the substrate is made at portions not shown, and the substrate is grounded. Thus, the dummy gate electrode can be fixed to the substrate potential without increasing the wring area.

Next, a second aspect of the present invention will be explained.

Figure 3A:
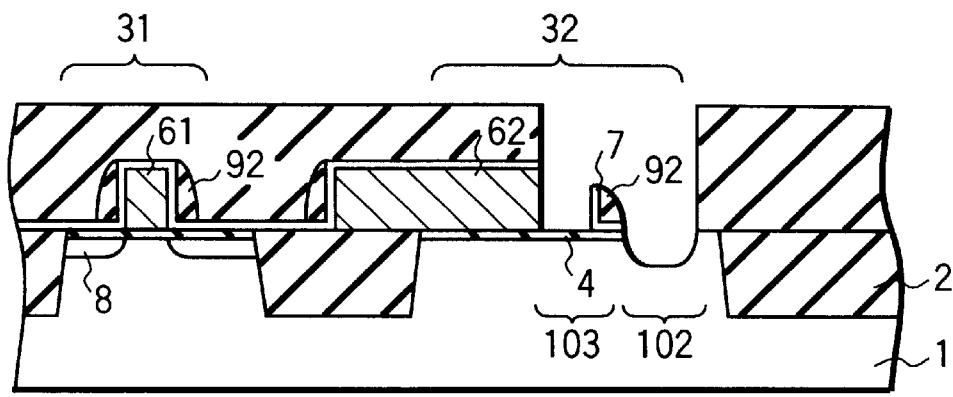
FIG. 3A is a cross-sectional view showing a structure of a semiconductor device according to a second aspect of the present invention after a first step of a producing method of the semiconductor device.
Figure 3B:
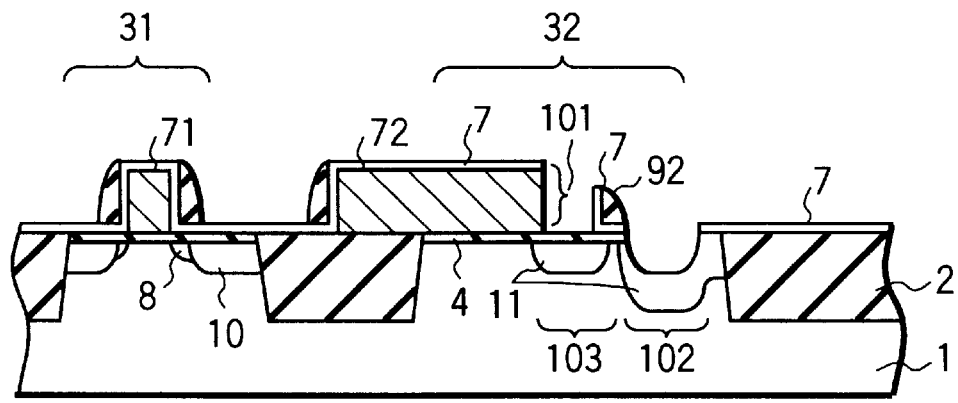
FIG. 3B is a cross-sectional view showing a structure of a semiconductor device according to a second aspect of the present invention after a second step of a producing method of the semiconductor device.
Figure 3C:
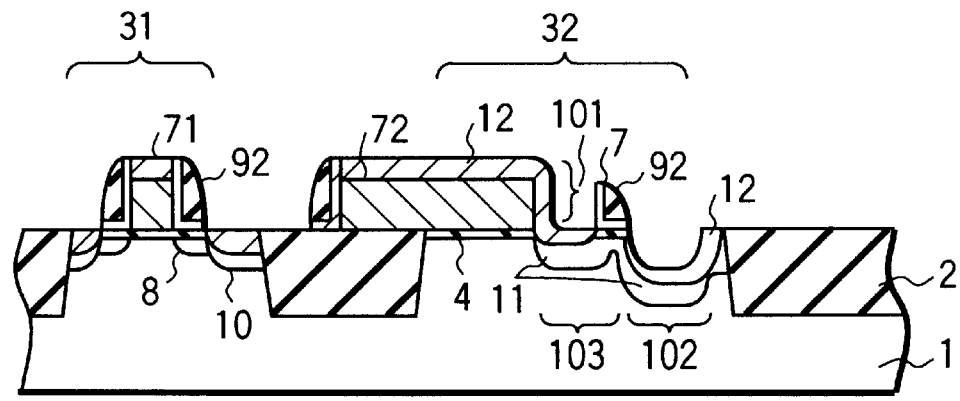
FIG. 3C is a cross-sectional view showing a structure of a semiconductor device according to a second aspect of the present invention after a third step of a producing method of the semiconductor device.

As shown in FIG. 3C, in a semiconductor device according to a second aspect, the dummy element region 32 unnecessary for the actual LSI operation is formed on the P-type silicon substrate 1, and a P+ dummy gate electrode 72 unnecessary for the actual LSI operation is formed on at least one part of the dummy element region 32 via the gate oxide film 4. In addition, a silicon nitride side wall 92 is formed on the entire side surface of the P+ dummy gate electrode 72, and the dummy element region 32 and the part of the dummy polysilicon gate electrode 72 are etched so that the P-type silicon substrate 1 of the dummy element region 32 in the lower layer can be exposed. Further, the titanium silicide 12 is selectively formed on the side surface and upper surface of the P+ dummy gate electrode 72 where the P-type silicon substrate 1 is exposed, and on the P+-diffusion layer 11 of the dummy element region 32 where the P-type silicon substrate 1 is exposed, so that the dummy gate electrode 72 is conductive with the P+-diffusion layer 11 of the dummy element region 32.

A method of producing the semiconductor device according to the second aspect of the present invention will be described below with reference to FIG. 3. Since the processes of FIGS. 1A and 1B are the same as those of the above-described first aspect, the detailed explanation of the processes is omitted.

After the processes of FIGS. 1A and 1B have been finished, a part of the dummy gate electrode 62 which is present in the dummy element region 32 is coated with resist 20 as shown in FIG. 3A. Then, after the LPCVD oxide film 7 in parts of the dummy gate electrode 62 which are not coated with the resist 20 and the dummy element region 32 is etched by hydrofluoric acid, the silicon is removed by etching in the manner of the RIE with the gate oxide film 4 employed as a stopper.

At this time, the LPCVD oxide film 7 on the surface is preliminarily removed by hydrofluoric acid in the dummy element region 32, and the remaining gate oxide film 4 is excessively over-etched so that the gate oxide film 4 is etched and a recess is formed while the dummy gate electrode 62 is etched (as represented by reference numeral 102 in FIG. 3A). Thus, there may be no problem even if a recess is formed on the P-type silicon substrate 1, for the reason that the selective ratio to the gate oxide film 4 at the dummy gate electrode 62 for the silicon RIE cannot be determined. In addition, the silicon nitride side wall 92 is not etched and thereby left as previously shown in FIG. 2C, but there may be no problem in the second aspect even if it is etched and lost simultaneously with the silicon.

FIG. 3B shows that after the process of FIG. 3A, the P+-diffusion layer 11 of the dummy element region 32 is fixed to the electric potential of the P-type silicon substrate 1 in the same process as that of FIG. 2A of the first aspect. Similarly to the first aspect, the P+ dummy gate electrode 72 is in the floating state at this stage since the P+ dummy gate electrode 72 is insulated from the P+-diffusion layer 11 of the dummy element region 32 via the gate oxide film 4. A recess is partially formed on the substrate in the dummy element region 32 (as represented by the reference numeral 102 of FIG. 3B), which may cause no problem for the reason that it is formed at the P+-diffusion layer 11 of the P-type silicon substrate 1. Similarly, when a recess is formed at a portion represented by reference numeral 103, on the P-type silicon substrate 1, the P+-diffusion layer 11 is fixed to the electric potential of the P-type silicon substrate 1. Further, of course, there may be no problem whether the silicon nitride side wall 92 is not etched and remain or not left.

FIG. 3C shows that after the process of FIG. 3B, the same salicide process as that of FIG. 2B of the first aspect is carried out.

At this time, similarly to the first aspect, the titanium silicide 12 on a side surface 101 of the P+ dummy gate electrode 72 is connected to the titanium silicide 12 of the P+-diffusion layer 11 in the dummy element region 32 so as to be short-circuited, and the P+ dummy gate electrode 72 is fixed to the electric potential of the P+-diffusion layer 11 in the dummy element region 32, i.e. the same electric potential as that of the P-type silicon substrate 1. At this time, the recess is formed at the portion 102 of the P-type silicon substrate 1, in the dummy element region 32, but this may cause no problem for formation of the titanium silicide 12 since the silicon surface is exposed at the accumulation of titanium. The following processes are the same as those of the first aspect, and their detailed explanation is omitted.

Next, a third aspect will be described.

Figure 4A:
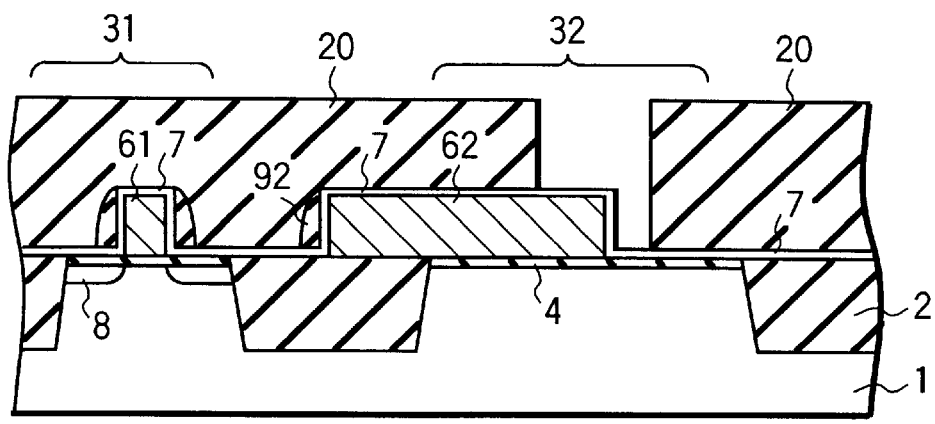
FIG. 4A is a cross-sectional view showing a structure of a semiconductor device according to a third aspect of the present invention after a first step of a producing method of the semiconductor device.
Figure 4B:
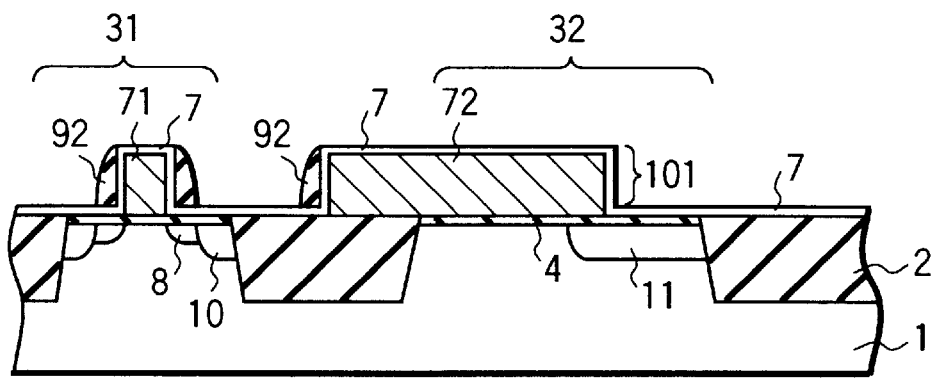
FIG. 4B is a cross-sectional view showing a structure of a semiconductor device according to a third aspect of the present invention after a second step of a producing method of the semiconductor device.
Figure 4C:
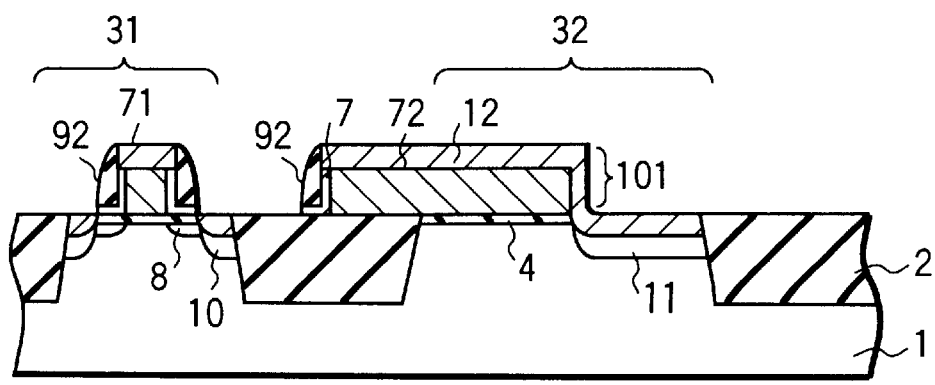
FIG. 4C is a cross-sectional view showing a structure of a semiconductor device according to a third aspect of the present invention after a third step of a producing method of the semiconductor device.

As shown in FIG. 4C, in a semiconductor device according to the third aspect, the dummy element region 32 unnecessary for the actual LSI operation is formed on the P-type silicon substrate 1, and the P+ dummy gate electrode 72 unnecessary for the actual LSI operation is formed on at least a part of the dummy element region 32 via the gate oxide film 4. After the silicon nitride side wall 92 has been formed on the entire side surface of the P+ dummy gate electrode 72, at least one part of the silicon nitride side wall 92 is peeled so that polysilicon on the side surface of the P+ dummy gate electrode 72 is exposed. Further, the titanium silicide 12 is selectively formed on the upper surface of the P+ dummy gate electrode 72 and the side surface of the P+ dummy gate electrode 72 where the polysilicon is exposed, in the dummy element region 32, so that the P+ dummy gate electrode 72 is conductive with the P+-diffusion layer 11 of the dummy element region 32.

Next, a semiconductor device according to a third aspect of the present invention and a producing method of the semiconductor device will be described with reference to FIG. 4. The same processes as those of the first aspect shown in FIGS. 1A and 1B are carried out, and their detailed description is omitted.

After the processes of FIGS. 1A and 1B, a part of the dummy gate electrode 62 in the dummy element region 32 is coated with the resist 20 as shown in FIG. 4A. Then, the silicon nitride side wall 92 at the portion of the dummy gate electrode 62 which is not coated with the resist 20 is etched by a high temperature phosphoric acid solution with the LPCVD oxide film 7 employed as a stopper, or etched by CDE (Chemical Dry Etching) of $CF_4+O_2$ gas with the LPCVD oxide film 7 employed as a stopper. At this time, no problem arise even if a recess is formed on the dummy gate electrode 92 or the P-type silicon substrate 1 in the dummy element region 32, for the reason that the selection ratio to the LPCVD oxide film 7 for the phosphoric acid solution and CDE cannot be determined.

FIG. 4B shows that after the process of FIG. 4A, the dummy element region 32 is fixed to the electric potential of the P-type silicon substrate 1 in the same process as that of the first aspect shown in FIG. 2A. Similarly to the first aspect, P+ dummy gate electrode 72 is in the floating state at this stage since the P+ dummy gate electrode 72 is insulated from the P+-diffusion layer 11 of the dummy element region 32 via the gate oxide film 4. At this time, even if a recess is formed on the P-type silicon substrate 1 in the dummy element region 32, no problem arise since it is on the P+-diffusion layer on the P-type silicon substrate 1. Similarly, even if a recess is formed on the dummy gate electrode 62, no problem is caused since it is unnecessary for the actual LSI operation.

FIG. 4C shows that after the process of FIG. 4B, the salicide process is carried out in the same manner as that of the first aspect shown in FIG. 2B.

At this time, similarly to the first aspect, the titanium silicide 12 on the side surface 101 of the P+ dummy gate electrode 72 is connected to the titanium silicide 12 of the P+-diffusion layer 11 in the dummy element region 32 so as to be short-circuited, and the P+ dummy gate electrode 72 is fixed to the electric potential of the P+-diffusion layer 11 in the dummy element region 32, i.e. the same electric potential as that of the P-type silicon substrate 1.

At this time, even if a recess is formed in the P+-diffusion layer 11 of the substrate, in the dummy element region 32, or even if it is formed at the P+ dummy gate electrode 72, since the silicon surface is exposed at accumulation of titanium in either case, the titanium silicide 12 on the side surface 101 is connected to the titanium silicide 12 of the P+-dummy gate electrode 72 and the P+-diffusion layer 11 in the dummy element region 32 so as to be short-circuited, and the P+ dummy gate electrode 72 is fixed to the same electric potential as that of the P-type silicon substrate 1. The following processes are the same as those of the first aspect, and their detailed explanation is omitted.

Next, a fourth aspect will be described.

Figure 5A:
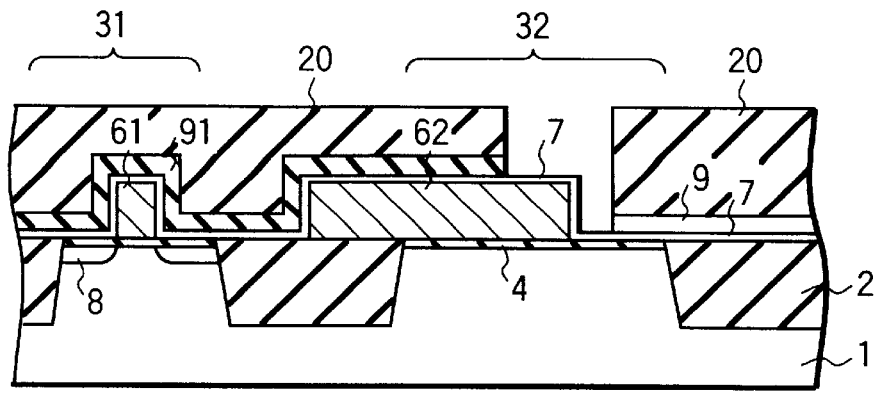
FIG. 5A is a cross-sectional view showing a structure of a semiconductor device according to a fourth aspect of the present invention after a first step of a producing method of the semiconductor device.
Figure 5B:
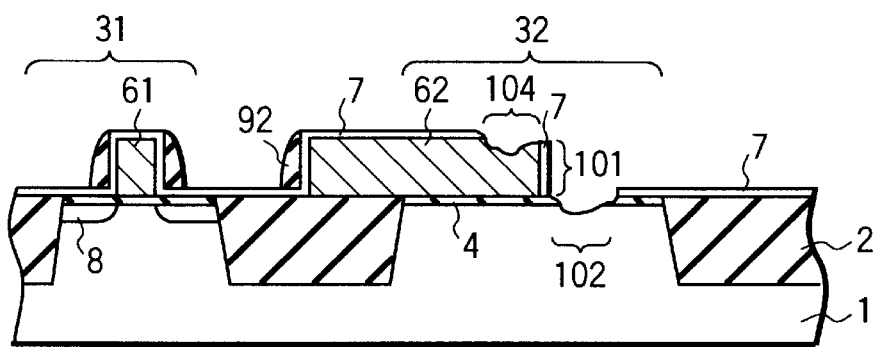
FIG. 5B is a cross-sectional view showing a structure of a semiconductor device according to a fourth aspect of the present invention after a second step of a producing method of the semiconductor device.
Figure 5C:
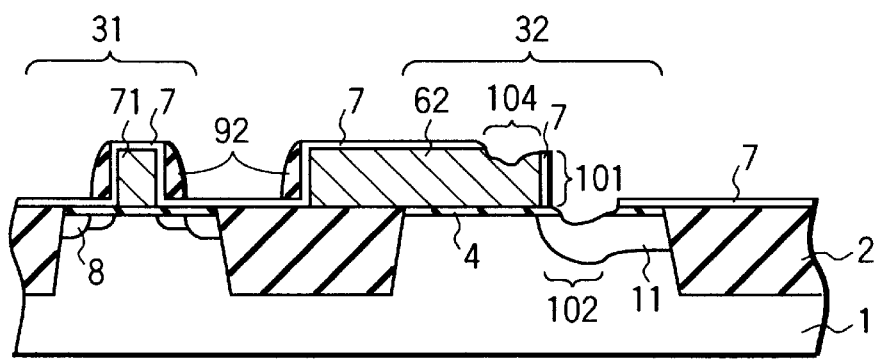
FIG. 5C is a cross-sectional view showing a structure of a semiconductor device according to a fourth aspect of the present invention after a third step of a producing method of the semiconductor device.
Figure 5D:
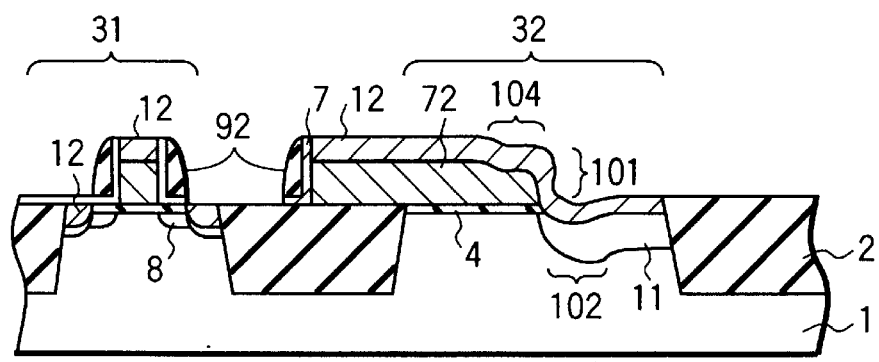
FIG. 5D is a cross-sectional view showing a structure of a semiconductor device according to a fourth aspect of the present invention after a fourth step of a producing method of the semiconductor device.

As shown in FIG. 5D, in a semiconductor device according to the fourth aspect, the dummy element region 32 unnecessary for the actual LSI operation is formed on the P-type silicon substrate 1, and the P+ dummy gate electrode 72 unnecessary for the actual LSI operation is formed on at least a part of the dummy element region 32 via the gate oxide film 4. After an insulation film of silicon nitride has been formed on the surface of the P+ dummy gate electrode 72, the insulation film on a part of the surface of the P+ dummy gate electrode 72 including at least a side surface thereof, in the dummy element region 32, is peeled in advance, the entire surface of the insulation film is processed by anisotropic etching, and the side surface of the P+ dummy gate electrode 72 other than the above partial side surface thereof is surrounded with the silicon nitride side wall 92. Further, the titanium silicide 12 is selectively formed on the upper surface of the P+ dummy gate electrode 72, and the side surface of the P+ dummy gate electrode 72 where the polysilicon is exposed since the insulation film is peeled in advance, and the P+-diffusion layer 11 in the dummy element region 32. In addition, the P+ dummy gate electrode 72 becomes conductive with the dummy element region 32.

Next, a semiconductor device according to the fourth aspect of the present invention and a producing method thereof will be described below with reference to FIG. 5. The same process as that of the first aspect shown in FIG. 1A is carried out and, therefore, its detailed description is omitted.

After the process of FIG. 1A, as shown in FIG. 5B, the LPCVD oxide film 7 is stacked so as to be 200 Å thick, the surface other than the element region necessary for operation of the LSI is coated with the resist, arsenic is ion-implanted at the acceleration voltage of 60 [keV] and a dose of 3e14 [1/cm²], and the resist is peel off, and RTA (Rapid-Thermal-Anneal) is executed at 950° C. for thirty seconds for activation, so that a thin diffusion layer 8 having an extension structure (whose depth is 800 Å) is formed.

At this time, the dummy gate electrode 62 and the dummy element region 32 are coated with the resist, and arsenic is not ion-implanted. After that, a LPCVD silicon nitride film 91 is stacked to be 1000 Å thick, and the surface of the dummy gate electrode 72 other than a part including at least the side surface thereof is coated with the resist 20.

Then, the silicon nitride film 91 at the portion of the dummy gate electrode 62 and the dummy element region 32, which is not coated with the resist 20, is etched by a high temperature phosphoric acid solution with the LPCVD oxide film 7 employed as a stopper, or etched by CDE of $CF_4+O_2$ gas with the LPCVD oxide film 7 employed as a stopper. At this time, no problem arise even if a recess is formed on the dummy gate electrode 62 or the substrate in the dummy element region 32, for the reason that the selection ratio to the LPCVD oxide film 7 for the etching using the phosphoric acid solution and CDE cannot be determined.

Next, as shown in FIG. 5B, after peeling the resist, the silicon nitride film 91 is entirely processed by anisotropic etching so as to be 1000 Å thick with the LPCVD oxide film 7 employed as a stopper. At this time, the silicon nitride film 91 stacked at the sides of the gate electrode 61 and the dummy gate electrode 62 is thick so as to be etched. The silicon nitride remains in accordance with the thickness after the anisotropic etching and, as a result, the gate-side wall 92 is formed to be about 1000 Å thick. FIG. 5B shows that recesses are formed on the substrate and the dummy gate electrode (as represented by reference numerals 102 and 104 in FIG. 5B) since the RIE of the silicon nitride film 91 does not stop the processing at the LPCVD oxide film 7 which is left at the stage of FIG. 5A or since the LPCVD oxide film 7 does not remain at the stage of FIG. 5A. However, it is needless to say that no problem arise if no recesses are formed on the P-type silicon substrate 1 and the dummy gate electrode 62.

Subsequently, FIG. 5C shows that after the process of FIG. 5B, the dummy element region 32 is fixed to the electric potential of the P-type silicon substrate 1 in the same process as that of the first aspect shown in FIG. 2A. Similarly to the first aspect, the P+ dummy gate electrode 72 is in the floating state at this stage since the P+ dummy gate electrode 72 is insulated from the P⁺-diffusion layer 11 of the dummy element region 32 via the gate oxide film 4.

In addition, at the stage of FIG. 5B, no problem arise even if the recess 102 is formed on the substrate of the P⁺-diffusion layer 11 in the dummy element region 32, since it is in the P⁺-diffusion layer 11 on the P-type silicon substrate 1. Similarly, no problem may also arise even if the recess 104 is formed on the dummy gate electrode 62, since it is unnecessary for the actual LSI operation. FIG. 5C shows that these recesses are formed, but, of course, no problem arise even when the recesses 102 and 104 are not formed.

Next, FIG. 5D shows that after the process of FIG. 5C, the salicide process is carried out in the same manner as that of the first aspect shown in FIG. 2B. At this time, similarly to the first aspect, the titanium silicide 12 on the side surface 101 of the P+ dummy gate electrode 72 is connected to the titanium silicide 12 of the P⁺-diffusion layer 11 in the dummy element region 32 so as to be short-circuited, and the P+ dummy gate electrode 72 is fixed to the electric potential of the P⁺-diffusion layer 11 in the dummy element region 32, i.e. the same electric potential as that of the P-type silicon substrate 1.

At this time, even if a recess is formed on the substrate 1 in the P⁺-diffusion layer 11, in the dummy element region 32, or even if it is formed at the P+ dummy gate electrode 72, since the silicon surface is exposed at accumulation of titanium in either case, the titanium silicide 12 on the side surface 101 is connected to the titanium silicide 12 of the P⁺-dummy gate 11 and the P⁺-diffusion layer 11 in the dummy element region 32 so as to be short-circuited, and the P+ dummy gate electrode 72 is fixed to the same electric potential as that of the P-type silicon substrate 1. The following processes are the same as those of the first aspect, and their detailed explanation is omitted.

Next, a fifth aspect will be described.

Figure 6A:
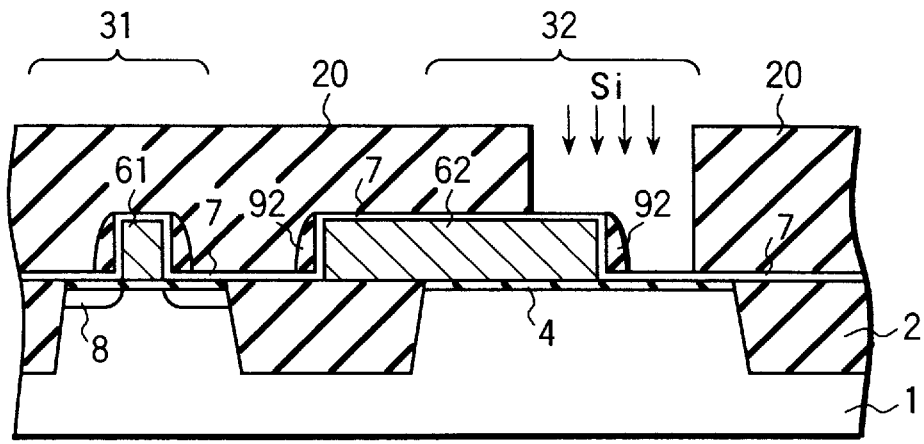
FIG. 6A is a cross-sectional view showing a structure of a semiconductor device according to a fifth aspect of the present invention after a first step of a producing method of the semiconductor device.
Figure 6B:
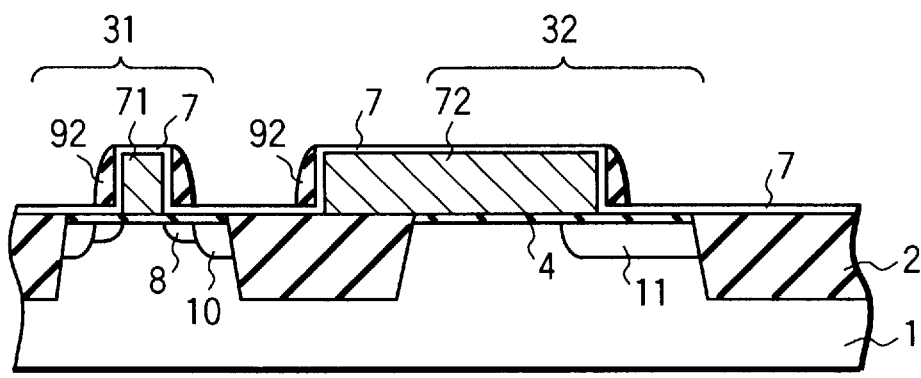
FIG. 6B is a cross-sectional view showing a structure of a semiconductor device according to a fifth aspect of the present invention after a second step of a producing method of the semiconductor device.
Figure 6C:
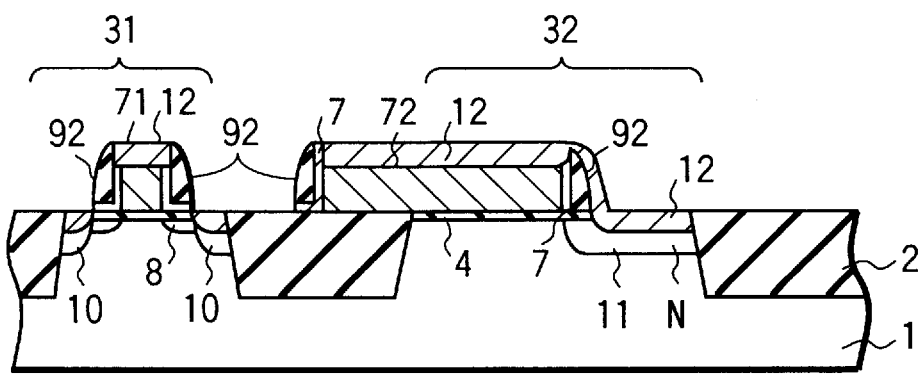
FIG. 6C is a cross-sectional view showing a structure of a semiconductor device according to a fifth aspect of the present invention after a third step of a producing method of the semiconductor device.

As shown in FIG. 6C, in a semiconductor device according to the fifth aspect, the dummy element region 32 unnecessary for the actual LSI operation is formed on the P-type silicon substrate 1, and the P+ dummy gate electrode 62 unnecessary for the actual LSI operation is formed on at least a part of the dummy element region 32 via the gate oxide film 4. The silicon nitride side wall 92 is formed on the entire side surface of the P+ dummy gate electrode 72, and silicon is ion-implanted at more than a predetermined dose, on the silicon nitride side wall 92 on at least a partial side surface of the dummy gate electrode 72 in the dummy element region 32. Further, the titanium silicide 12 is selectively formed on the upper surface of the P+ dummy gate electrode 72, on silicon nitride side wall 92 on the side surface of the P+ dummy gate electrode 72 where the silicon is present at high concentration, and in the dummy element region 32, so that the dummy gate electrode 72 is short-circuited from the P⁺-diffusion layer 11 in the dummy element region 32.

Next, a semiconductor device according to the fifth aspect of the present invention and a producing method thereof will be described below with reference to FIG. 6. The same processes as those of the first aspect shown in FIGS. 1A and 1B are carried out and, therefore, their detailed description is omitted.

After the processes of FIGS. 1A and 1B, as shown in FIG. 6A, a part of the dummy gate electrode 62 which is present in the dummy element region 32 is coated with the resist 20. After that, silicon is ion-implanted at the acceleration voltage of 30 [keV] and the dose of 1e16 [1/cm²] onto the silicon nitride side wall 92.

Subsequently, as shown in FIG. 6C, after the process of FIG. 6A, the dummy element region 32 is fixed to the electric potential of the P-type silicon substrate 1 in the same process as that of the first aspect shown in FIG. 2A. Similarly to the first aspect, the P+ dummy gate electrode 72 is in the floating state at this stage since the P+ dummy gate electrode 72 is insulated from the P⁺-diffusion layer 11 of the dummy element region 32 via the gate oxide film 4.

FIG. 6C shows that after the process of FIG. 6B, the salicide process is carried out in the same manner as that of the first aspect shown in FIG. 2B. At this time, since silicon implanted at high concentration reacts with titanium on the surface of the silicon nitride side wall 92, the titanium silicide 12 is also formed on the silicon nitride side wall 92. Thus, the titanium silicide 12 on the P+ dummy gate electrode 72 becomes conductive with titanium silicide on the P+-diffusion layer 11 in the dummy element region 32 via the titanium silicide 12 on the silicon nitride side wall 92 (this is generally called bridging) and, therefore, the P+ dummy gate electrode 72 is fixed to the same electric potential as that of the P-type silicon substrate 1.

The characterized matter here is that at the process of FIG. 6A, the dose is not limited since the silicon is ion-implanted into the dummy gate electrode 72 and the P$^+$-diffusion layer 11 of the dummy element region 32 which are quite indifferent from the bonding leak or gate pressure. That is, silicon can be ion-implanted at the dose enough to form the titanium silicide 12 on the silicon nitride side wall 92. Further, the titanium silicide 12 on the silicon nitride side wall 92 is made conductive with the P$^+$-diffusion layer 11 of the dummy element region 32 and the dummy gate electrode 72 is fixed to the same electric potential as that of the P-type silicon substrate 1, and it is not particularly necessary to make the electric current flow. Therefore, no problem does not arise even if the titanium silicide 12 on the silicon nitride side wall 92 is much thinner than that formed at the other portions. The following processes are the same as those of the first aspect, and their detailed description is omitted.

The aspects of the present invention have been described above. Of course, however, the present invention is not limited to those and can be variously modified in a range which does not exceed its gist. For example, in the above-described first to fifth aspects, cobalt, nickel, platinum, palladium, etc. can be employed as high melting point metals other than titanium. In addition, the first to fifth aspects have been described by citing the NMOS, but they can be applied to PMOS and CMOS. Similarly, of course, LOCOS (Local Oxidation of Silicon) can be employed as element separation. Further, the conditions of the producing method of the semiconductor device according to the present invention are not limited to the above aspects, and of course, various conditions can be employed.

As described above, in the present invention, the gate electrode region unnecessary for the actual circuit operation is formed in the semiconductor device comprising the dummy diffusion region unnecessary for the actual circuit operation. At this time, the dummy gate electrode is short-circuited with the dummy diffusion layer through the high melting point silicide, the dummy diffusion layer region serves as a diffusion layer of the coaxially conductive type with the substrate (or the well) and the dummy gate electrode is thereby fixed to the same electric potential as that of the substrate (or the well). Thus, the LSI operation can be made stable without the floating dummy gate electrode.

That is, since the dummy gate electrode can be entirely fixed to the same electric potential as that of the substrate (or the well) in the structure of the present invention as described above, both processes of the gate electrode process and the flattening of the interlayer insulation film can be uniformly carried out and the LSI operation does not become unstable.

Further, according to the producing method, only one lithographic process and one etching or ion-implantation process are increased, and the dummy gate electrode can be entirely fixed to the same electric potential as that of the substrate (or the well). In addition, even if recesses are formed on the substrate in the dummy element region and the dummy gate electrode during the processes, no problem arise and the process margin is large.

As described above in detail, according to the present invention, it is possible to provide the semiconductor device wherein by forming the dummy gate electrode on the dummy diffusion layer region and by short-circuiting the dummy gate electrode and the dummy diffusion layer region in the salicide process without increasing the wiring area, the dummy gate electrode can be fixed to the predetermined electric potential, the stable operation of LSI can be kept and the process margin is large, and it is also possible to provide the producing method of the semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A method of producing a semiconductor device, comprising:
    a first step of delimiting a dummy element region on a semiconductor substrate;
    a second step of forming a dummy polysilicon gate electrode above at least a part of the dummy element region via a gate insulation film;
    a third step of forming an insulation film on the side surface of the dummy polysilicon gate electrode; and
    a fourth step of selectively forming a high melting point metal silicide on the dummy polysilicon gate electrode and the dummy element region,
    wherein the dummy polysilicon gate electrode is short-circuited with the dummy element region by the high melting point metal silicide.

2. A method of producing a semiconductor device according to claim 1, further comprising a step of forming a diffusion layer of the same electric conductive type as that of the semiconductor substrate in the dummy element region.

3. A method of producing a semiconductor device according to claim 1, wherein the high melting point metal silicide is formed in a salicide process.

4. A method of producing a semiconductor device according to claim 1, wherein in the second step, a polysilicon gate electrode is formed above an element region contributing LSI action together with the dummy polysilicon gate electrode.

5. A method of producing a semiconductor device according to claim 4, wherein in the fourth step, the high melting point metal silicide is also formed on the polysilicon gate electrode and the element region.

6. A method of producing a semiconductor device according to claim 1, wherein in the third step, an insulation film is formed on an entire side surface of the dummy polysilicon gate electrode;
    said method further comprising a step of etching a part of polysilicon of the dummy polysilicon gate electrode in the dummy element region until the semiconductor substrate under the dummy polysilicon gate electrode in the dummy element region is exposed, after the third step,
    and wherein in the fourth step, the high melting point metal silicide is selectively formed on side and upper surfaces of the dummy polysilicon gate electrode which is etched in the third step and on the dummy element region where the semiconductor substrate is exposed.

7. A method of producing a semiconductor device according to claim 6, further comprising a step of forming a diffusion layer of the same conductive type as that of the semiconductor substrate in the dummy element region where the semiconductor substrate is exposed.

8. A method of producing a semiconductor device according to claim 6, wherein the high melting point metal silicide is formed in a salicide process.

9. A method of producing a semiconductor device according to claim 1, wherein in the third step, an insulation film is formed on an entire side surface of the dummy polysilicon gate electrode;

said method further comprising a step of exposing polysilicon on the side surface of the dummy polysilicon gate electrode by removing at least a part of the insulation film on the side surface of the dummy polysilicon gate electrode above the dummy element region, after the third step, and wherein in the fourth step, the high melting point metal silicide is selectively formed on the upper surface of the dummy polysilicon gate electrode, on the side surface thereof where the polysilicon is exposed, and on the dummy element region.

10. A method of producing a semiconductor device according to claim 9, further comprising a step of forming a diffusion layer of the same conductive type as that of the semiconductor substrate in the dummy element region.

11. A method of producing a semiconductor device according to claim 9, wherein the high melting point metal silicide is formed in a salicide process.

12. A method of producing a semiconductor device according to claim 1, wherein in the third step, an insulation film is formed on a surface of the dummy polysilicon gate electrode;

said method further comprising a step of preliminarily removing the insulation film formed on the partial surface including at least the side surface of the dummy polysilicon gate electrode in the dummy element region, and a step of surrounding with the insulation film the side surface of the dummy polysilicon gate electrode other than the partial side surface thereof where the insulation film is preliminarily removed, by processing the entire surface of the insulation film in anisotropic etching, and wherein in the fourth step, the high melting point metal silicide is selectively formed on the upper surface of the dummy polysilicon gate electrode, on the side surface thereof where the insulation film is preliminarily removed so as to expose polysilicon, and on the dummy element region.

13. A method of producing a semiconductor device according to claim 12, further comprising a step of forming a diffusion layer of the same conductive type as that of the semiconductor substrate in the dummy element region.

14. A method of producing a semiconductor device according to claim 12, wherein the high melting point metal silicide is formed in a salicide process.

15. A method of producing a semiconductor device according to claim 1, wherein in the third step, an insulation film is formed on the entire side surface of the dummy polysilicon gate electrode;

said method further comprising a step of introducing a predetermined amount of silicon into the insulation film on at least a partial side surface of the dummy polysilicon gate electrode in the dummy element region, after the third step, and wherein in the fourth step, the high melting point metal silicide is selectively formed on the upper surface of the dummy polysilicon gate electrode, on the insulation film on the side surface thereof into which the silicon is introduced, and on the dummy element region.

16. A method of producing a semiconductor device according to claim 15, further comprising a step of forming a diffusion layer of the same conductive type as that of the semiconductor substrate in the dummy element region.

17. A method of producing a semiconductor device according to claim 15, wherein the high melting point metal silicide is formed in a salicide process.

\* \* \* \* \*